United States Patent [19]
Gonzalez et al.

[11] Patent Number: 5,714,786
[45] Date of Patent: Feb. 3, 1998

[54] TRANSISTORS HAVING CONTROLLED CONDUCTIVE SPACERS, USES OF SUCH TRANSISTORS AND METHODS OF MAKING SUCH TRANSISTORS

[75] Inventors: Fernando Gonzalez, Boise; David Kao, Meridian, both of Id.

[73] Assignee: Micron Technology, Inc., Boise, Id.

[21] Appl. No.: 741,828

[22] Filed: Oct. 31, 1996

[51] Int. Cl.$^6$ .......................... H01L 29/78; H01L 27/108
[52] U.S. Cl. .......................... 257/366; 257/296; 257/344; 257/367; 257/412
[58] Field of Search .......................... 257/296, 365–367, 257/344

[56] References Cited

U.S. PATENT DOCUMENTS

| | | | |
|---|---|---|---|
| 4,213,139 | 7/1980 | Rao | 257/366 |
| 4,319,263 | 3/1982 | Rao | 257/366 |
| 4,472,821 | 9/1984 | Mazin et al. | 257/366 |
| 4,975,385 | 12/1990 | Beinglass et al. | |
| 5,115,288 | 5/1992 | Manley | |
| 5,250,450 | 10/1993 | Lee et al. | |
| 5,252,504 | 10/1993 | Lowrey et al. | |
| 5,257,238 | 10/1993 | Lee et al. | |
| 5,292,681 | 3/1994 | Lee et al. | |
| 5,324,960 | 6/1994 | Pfiester et al. | |
| 5,397,727 | 3/1995 | Lee et al. | |
| 5,425,392 | 6/1995 | Thakur et al. | |
| 5,439,835 | 8/1995 | Gonzalez | |
| 5,495,441 | 2/1996 | Hong | |
| 5,513,137 | 4/1996 | Lee et al. | |

OTHER PUBLICATIONS

Tiao-yuan Huang, William W. Yao, Russell A. Martin, Alan G. Lewis, Mitsumasa Koyanagi, & John Y. Chen, "A Novel Submicron LDD Transistor with Inverse-T Gate Structure", IDEM 1986, p. 742–745.

I. C. Chen, J. P. Lin, and C. W. Teng, Article from 1990 Symposium on VLSI Technology entitled: "A Highly Reliable 0.3 μm N–channel MOSFET Using Poly Spacers", pp. 39–40.

Masataka Minami, Yasuo Sawahata, Hiroshi Matsuki and Takahiro Nagano, Article from 1990 Symposium on VLSI Technology entitled: "A High Speed & High Reality MOSFET Utilizing an Auxiliary Gate", pp.41–42.

F.-C. Hsu and K.-Y. Chiu, Article from IEEE Electron Device Letters, vol. EDL-5, No. 5, entitled: "Evaluation of LDD MOSFET's Based on Hot–Electron–Induced Degradation," May 1984, pp. 162–165.

*Primary Examiner*—Gene M. Munson
*Attorney, Agent, or Firm*—Killworth, Gottman, Hagan & Schaeff, L.L.P.

[57] ABSTRACT

An improved transistor structure includes an insulated conductive gate spacer which is contacted and driven separately from the gate of the transistor. The gate spacer serves as a control or second gate for the transistor and may be used throughout an integrated circuit or it may be preferred to use the improved transistor only in critical speed paths of an integrated circuit. Delays within circuits including the improved transistor are reduced since the drain voltage can be higher than VCC and the BVDSS and subthreshold voltage are substantially higher than standard LDD transistors. When the improved transistor is used selectively within an integrated circuit, the remaining devices can be structured as standard LDD transistors using the gate spacers in a conventional manner.

14 Claims, 2 Drawing Sheets

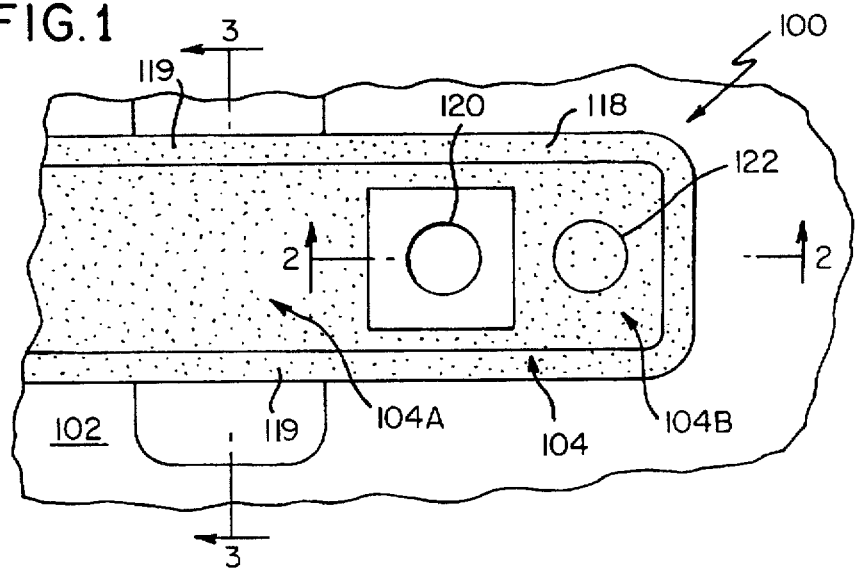
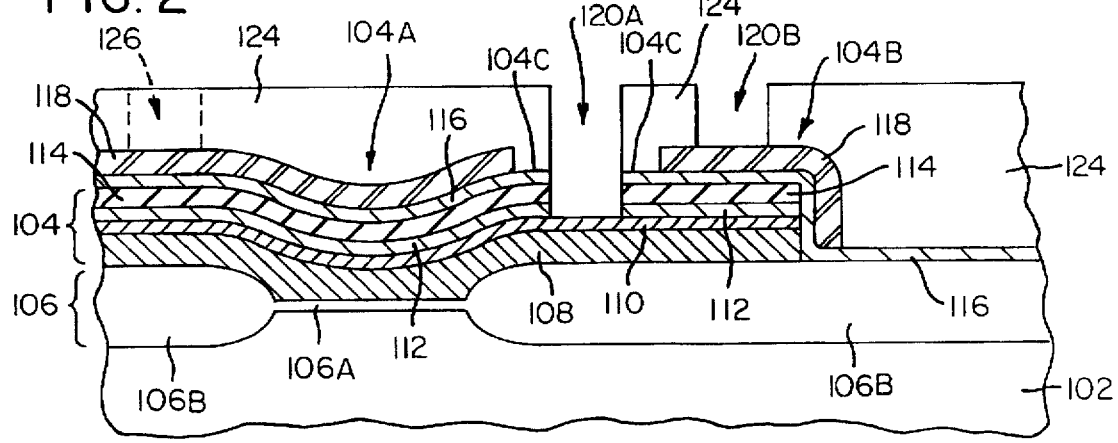
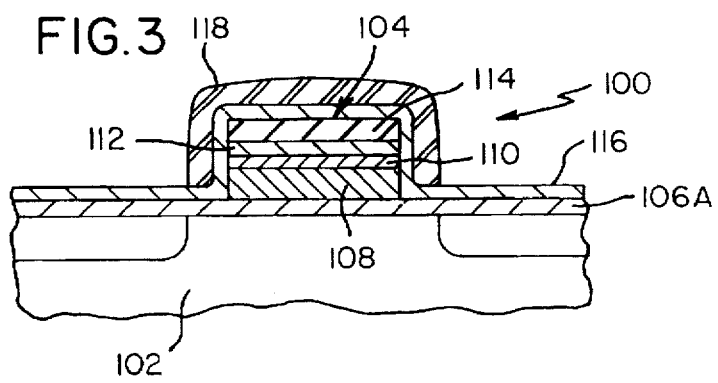

TRANSISTORS HAVING CONTROLLED CONDUCTIVE SPACERS, USES OF SUCH TRANSISTORS AND METHODS OF MAKING SUCH TRANSISTORS

BACKGROUND OF THE INVENTION

The present invention relates in general to transistor structures and, more particularly, to improved transistor structures, their uses and methods for making them wherein an insulated conductive gate spacer is contacted and driven separately from the gate.

The use of lightly doped drain (LDD) regions in very large scale integrated (VLSI) metal oxide semiconductor (MOS) integrated circuit structures is well known to overcome electric field effects near the drain region which can cause short channel effects, punchthrough and hot carrier degradation. The formation of such LDD regions between the channel and the more heavily and deeper doped conventional drain region spreads out the electric field which mitigates short-channel effects, reduces hot carrier generation and increases the punchthrough breakdown voltage.

Spacers formed on the sidewalls of the gate electrodes of MOS transistors have been utilized in the formation of LDD regions. Both electrically nonconducting, typically oxide, spacers and electrically conducting spacers have been used; however, the spacers normally are not connected to a defined potential such that they float within the MOS structure including the transistors. When conductive spacers have been used for operation of an MOS transistor, they have served as an extension of the gate electrode upon which they are formed.

While LDD transistors are an improvement over conventional MOS transistors, these transistors also have disadvantages in their own right. For example, the transistor drive current is reduced in LDD transistors due to the transistor series resistance of the LDD regions.

Accordingly, there is an ongoing need for improved transistor structures which can be used to improve various characteristics of standard LDD transistors particularly, for example, the transistor drive current and gate delays of logic circuits made up by the transistors. Preferably, the improved transistors could be used together with or in place of standard LDD transistors in an integrated circuit. Such an improved transistor structure should provide higher breakdown voltage from drain to source side (BVDSS) and subthreshold voltages.

SUMMARY OF THE INVENTION

This need for improvement over existing LDD transistors is met by the invention of the present application wherein an insulated conductive gate spacer is formed on a transistor and contacted and driven separately from the gate of the transistor. The gate spacer serves as a control or second gate for the transistor which may be used throughout an integrated circuit or it may be preferred to use the improved transistor only in critical speed paths of an integrated circuit. Delays within circuits including the improved transistor are reduced since the drain voltage can be higher than VCC and the BVDSS and subthreshold voltage are substantially higher than standard LDD transistors. When the improved transistor is used selectively within an integrated circuit, the remaining devices can be structured as standard LDD transistors using the gate spacers in a conventional manner.

In accordance with one aspect of the present invention, a transistor structure comprises a gate structure formed on a first oxide layer on a silicon structure. A secondary oxide layer is formed on the gate structure and a conductive spacer is formed around the gate structure on the secondary oxide layer. The conductive spacer includes an aperture over a portion of the gate structure and a first contact to the gate structure is made through the portion of the gate structure corresponding to the aperture. A second contact is made to the conductive spacer.

In accordance with another aspect of the present invention, a dual gate transistor structure comprises a gate structure formed on a first oxide layer on a silicon structure and defines a first gate of the transistor structure. A secondary oxide layer is formed over the gate structure and a conductive spacer is formed around the gate structure on the secondary oxide layer. The conductive spacer defines a second gate of the transistor structure and the conductive spacer includes an aperture over a portion of the gate structure. A first-contact is made to the first gate through the portion of the gate structure corresponding to the aperture, and a second contact is made to the conductive spacer.

In accordance with yet another aspect of the present invention, a transistor structure comprises an actual gate and a pseudo gate formed on a first oxide layer on a silicon structure. A secondary oxide layer is formed over the actual and pseudo gates. A conductive spacer is formed around the actual and pseudo gates on the secondary oxide layer with the conductive spacer including an aperture over a portion of the actual gate. A first contact is made to the actual gate through the portion of the actual gate corresponding to the aperture and a second contact is made to the conductive spacer at the pseudo gate.

In accordance with still another aspect of the present invention, a method of making a transistor structure comprises forming a gate structure on a first oxide layer on a silicon structure. A secondary oxide layer is formed on the gate structure and a conductive spacer is formed around the gate structure on the secondary oxide layer. The conductive spacer is removed from a portion of the gate structure and a first contact is formed to the gate structure through the portion of the gate structure from which the conductive spacer has been removed. And, a second contact is formed to the conductive spacer.

In accordance with an additional aspect of the present invention, a method of making a transistor structure comprises forming a gate on a first oxide layer on a silicon structure. A conductive spacer connection support is formed on the first oxide layer on the silicon structure and a secondary oxide layer is formed on the gate and the conductive spacer connection support. A conductive spacer is formed around the gate and the conductive spacer connection support on the secondary oxide layer. The conductive spacer is removed from a portion of the gate and a first contact is formed to the gate through the portion of the gate structure from which the conductive spacer has been removed. A second contact is formed to the conductive spacer at the conductive spacer connection support.

In accordance with a further aspect of the present invention, a method of making a dual gate transistor structure comprises forming a gate structure on a first oxide layer on a silicon structure to define a first gate. A secondary oxide layer is formed over the gate structure and a conductive spacer is formed around the gate structure on the secondary oxide layer to define a second gate. The conductive spacer includes an aperture over a portion of the gate structure and a first contact is formed to the first gate through the portion of the gate structure corresponding to the aperture. A second contact is formed to the conductive spacer.

In accordance with a still further aspect of the present invention, a method of making a transistor structure comprises forming an actual gate and a pseudo gate on a first oxide layer on a silicon structure. A secondary oxide layer is formed over the actual gate and the pseudo gate and a conductive spacer is formed around the actual gate and the pseudo gate on the secondary oxide layer. The conductive spacer is removed from a portion of the actual gate and a first contact is formed to the actual gate through the portion of the actual gate from which the conductive spacer has been removed. A second contact is formed to the conductive spacer at the pseudo gate.

In accordance with yet still another aspect of the present invention, an integrated circuit structure comprises a first plurality of conventional LDD transistors, and a second plurality of transistors which each comprise a gate structure formed on a first oxide layer on a silicon structure with a secondary oxide layer formed on the gate structure. A conductive spacer is formed around the gate structure on the secondary oxide layer. The conductive spacer includes an aperture over a portion of the gate structure. A first contact is made to the gate structure through the portion of the gate structure corresponding to the aperture and a second contact is made to the conductive spacer. The first plurality of conventional LDD transistors and the second plurality of transistors are interconnected to form the integrated circuit structure.

In accordance with yet a further aspect of the present invention, a method of making an integrated circuit structure comprises forming gate structures on a first oxide layer on a silicon structure and forming a secondary oxide layer on the gate structures. Conductive spacers are formed around the gate structures. The conductive spacers are utilized to form LDD transistor structures associated with a first number of the gate structures and are utilized to form transistor structures associated with a second number of the gate structures. The transistor structures associated with the second number of the gate structures are formed by removing the conductive spacer from a portion of the second number of the gate structures, forming first contacts to the second number of gate structures through the portion of the second number of gate structures from which the conductive spacer has been removed, and forming second contacts to the conductive spacers.

Thus, the present invention provides an improved transistor structure which includes an insulated electrically conductive gate spacer which is contacted and controlled separately from the gate of the transistor. The improved transistor structure also provides improved transistor drive current and reduced delays within integrated circuits including the improved transistor. The improved transistor structure can be used together with LDD transistors, for example, at least in critical speed paths. The present invention also provides uses for the improved transistor structure and methods for making it, and uses for the combined LDD and improved transistor structures and methods for making the combined LDD and improved transistor structures.

Other features and advantages of the invention will be apparent from the following description, the accompanying drawings and the appended claims.

BRIEF DESCRIPTION OF THE DRAWINGS

FIG. 1 is a fragmentary plan view of an improved transistor made in accordance with the present invention;

FIG. 2 is a fragmentary sectional view of the improved transistor of FIG. 1 taken, along section line 2—2;

FIG. 3 is a fragmentary sectional view of the improved transistor of FIG. 1 taken along section line 3—3;

DETAILED DESCRIPTION OF THE INVENTION

Figure 4:
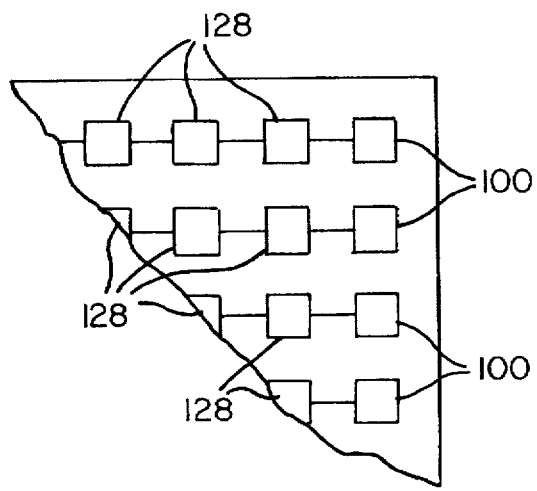
FIG. 4 is a schematic illustration of an integrated circuit including transistors of the present invention together with LDD transistors.

An improved transistor 100 including the structure and made in accordance with the invention of the present application is shown in FIGS. 1–3. The transistor 100 is formed on a base layer or silicon structure 102 which can be one or more semiconductor layers or structures and includes active or operable portions of semiconductor devices. A gate structure 104 is formed on a first oxide layer 106 formed on the silicon structure 102. The gate structure 104 is illustrated as a multilayer gate stack which may be formed for an array device for which the present invention is initially being used.

The first oxide layer 106 includes thin gate oxide regions represented by the region 106A defining active regions of the structure and substantially thicker field oxide regions 106B defining isolation regions. As illustrated, local oxidization of silicon (LOCOS) isolation is utilized; however, it is noted that the invention of the present application can be utilized with other well known isolation technologies as will be apparent.

The multilayer gate stack comprises a polysilicon gate layer 108, a silicided polysilicon layer 110, an oxide layer 112 and a nitride layer 114. A secondary oxide layer 116 is formed on the gate structure 104. The secondary oxide layer 116 may be formed, for example, by a chemical vapor deposition (CVD) of tetraethoxysilane (TEOS) or rapid thermal processor (RTP) oxide (RTO). A conductive gate spacer 118 is formed around the gate structure 104 on the secondary oxide layer 116 with the conductive gate spacer 118 being removed from a portion 104C of the gate structure 104 to form an aperture in the spacer 118. The conductive gate spacer 118 can be formed, for example, from titanium silicide (TiSi).

A first portion 104A of the gate structure 104 serves as a first or actual gate for the transistor 100 while a second portion 104B of the gate structure 104 forms a pseudo gate or conductive spacer connection support to permit separate connection to the conductive gate spacer 118 which serves as a control or second gate 119 for the transistor 100. The portion of the conductive gate spacer 118 which is removed is generally on the top of the first portion 104A of the gate structure 104 and can be removed by the reactive ion etching of the TiSi layer which forms the gate spacer 118.

A first contact is made to the first portion 104A of the gate structure 104 where the conductive gate spacer 118 has been removed, i.e., through an aperture formed in the spacer 118, and a second contact is made to the conductive gate spacer 118. For other isolation arrangements or other embodiments of the transistor of the invention of the present application, the first portion 104A and the second portion 104B of the gate structure 104 may be formed separately from one another.

Contacting areas 120, 122 for the first gate and second gate are shown in FIG. 1 and in FIG. 2 by contact openings 120A, 122A made through a mask 124, not shown in FIGS. 1 and 3 for clarity of illustration. It is also possible to contact the gate spacer 118 over the first portion 104A of the gate structure 104 where the conductive gate spacer 118 has not been removed. Such connection to the gate spacer 118 is illustrated in FIG. 2 where a portion of the conductive gate spacer 118 is shown and a contact opening 126 is illustrated in dotted lines. While only a single transistor 100 is illustrated in the drawings, the gate structure 104 can be common to a number of transistors and can comprise a wordline for an integrated array or storage device.

In one embodiment of the invention, the gate length is 0.1 μm and is electrically isolated from the gate spacer 118 or second gate which is electrically connected to a separate driver. The spacer gate or second gate 119 preferably is formed over the thicker field oxide so that the gate-induced drain leakage (GIDL) effect is not aggravated if the potential on the second gate goes negative in the low off state. Thus, turn off of the transistor 100 can be ensured by use of a negative voltage on the second gate 119. The drive current of the transistor 100 is like a 0.1 μm device but the subthreshold voltage and punchthrough are substantially that of a 0.3 μm device.

The structure of the transistor 100 may be used throughout an integrated circuit; however, it may be preferred to use the structure of the transistor 100 only in critical speed paths of an integrated circuit to gain speed since the drain voltage can be higher than VCC and the BVDSS and subthreshold voltage are substantially higher. Where the structure of the transistor 100 is used selectively within an integrated circuit, the remaining devices can be structured as standard LDD transistors using the spacers in a conventional manner. An integrated circuit combining LDD transistors 128 and transistors 100 is schematically illustrated in FIG. 4. It is also possible to scale down the gate spacer 118 for compaction of the device.

Figure 5:
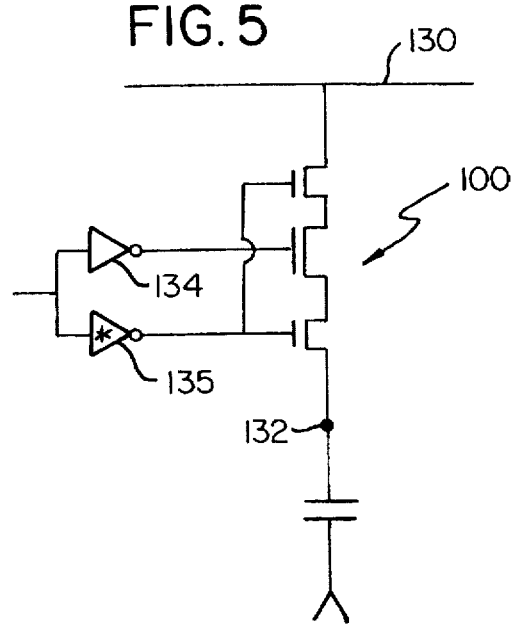
FIG. 5 is a schematic illustration of use of a transistor of the present invention in a dynamic random access memory (DRAM)

The transistor 100 is initially being used in array devices; however, it should be apparent that the transistor 100 can be used in a large variety of applications to provide the noted improvements in performance. For example, the transistor 100 can be used in a dynamic random access memory (DRAM) as schematically shown in FIG. 5 where the transistor 100 is connected between a data line 130 and a storage node 132 with the first and second gates of the transistor 100 being driven by rowline drivers 134, 135, respectively. The voltage swing between off and on for the first gate controlled by the driver 134 can be less than the swing between off and on for the second gate controlled by the driver 135. In this way, it is possible to turn off the second gate by driving it to a negative potential and to turn on the second gate by driving it to a potential higher than the on potential for the first gate.

Figure 6:
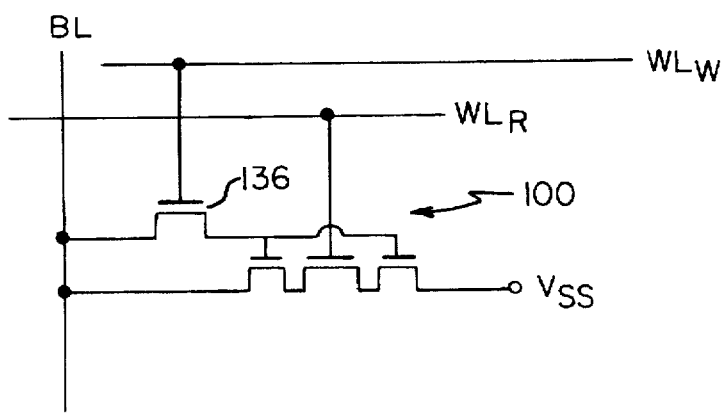
FIG. 6 is a schematic illustration of use of a transistor of the present invention in a semi-static low power DRAM cell.

In another example schematically shown in FIG. 6, the transistor 100 is used in a semi-static low power DRAM cell as the nMOS read transistor with the parasitic capacitances of the spacer gates or spacer transistors being used for storage, and a pMOS transistor 136 being used as the write transistor for the cell. In FIGS. 5 and 6, the spacer gate or second gate 119 of the transistor 100 is illustrated as two smaller gates to either side of the first gate of the transistor 100 as should be apparent from the foregoing description.

While methods of making the transistor 100 of the present application are apparent from the foregoing description, for sake of clarity a basic method will be briefly outlined. A method of making the transistor 100 comprises forming a gate structure on a first oxide layer on a silicon structure and a secondary oxide layer on the gate structure. A conductive spacer is formed around the gate structure on the secondary oxide layer and the conductive spacer is removed from a portion of the gate structure to form an aperture in the spacer. A first contact is formed to the gate structure through the portion of the gate structure from which the conductive spacer has been removed, i.e. through the aperture in the spacer. And, a second contact is formed to the conductive spacer.

Similarly, a method for making an integrated circuit having conventional LDD transistors and transistors structured as the transistor 100 comprises forming gate structures on a first oxide layer on a silicon structure and a secondary oxide layer on the gate structures. Conductive spacers are formed around the gate structures. The conductive spacers are utilized to form LDD transistor structures associated with a first number of the gate structures and to form transistor structures of the present invention associated with a second number of the gate structures. The transistor structures of the present invention are formed by removing the conductive spacer from portions of the second number of gate structures and forming first contacts to the second number of gate structures through the apertures corresponding to the portions of the second number of gate structures from which the conductive spacer has been removed. Second contacts are formed to the conductive spacers.

Having, thus, described the invention of the present application in detail and by reference to preferred embodiments thereof, it will be apparent that modifications and variations are possible without departing from the scope of the invention defined in the appended claims.

What is claimed is:

1. A transistor structure comprising:
   a gate structure formed on a first oxide layer on a silicon structure;
   a secondary oxide layer formed on said gate structure;
   a conductive spacer formed around said gate structure on said secondary oxide layer, said conductive spacer including an aperture over a portion of said gate structure;
   a first contact to said gate structure through said portion of said gate structure corresponding to said aperture; and
   a second contact to said conductive spacer.

2. A transistor structure as claimed in claim 1 wherein said gate structure comprises a gate and a conductive spacer connection support separated from said gate wherein said portion of said gate structure corresponding to said aperture is a portion of said gate, and said second contact is made at said conductive spacer connection support.

3. A transistor structure as claimed in 1 wherein said gate structure comprises a wordline.

4. A transistor structure as claimed in 1 wherein said gate structure comprises a multilayer structure.

5. A dual gate transistor structure comprising:
   a gate structure formed on a first oxide layer on a silicon structure and defining a first gate;
   a secondary oxide layer formed over said gate structure;
   a conductive spacer formed around said gate structure on said secondary oxide layer, said conductive spacer defining a second gate and including an aperture over a portion of said gate structure;
   a first contact to said first gate through said portion of said gate structure corresponding to said aperture; and
   a second contact to said conductive spacer.

6. A transistor structure comprising:

an actual gate and a pseudo gate formed on a first oxide layer on a silicon structure, said actual and pseudo gates being separated from one another;

a secondary oxide layer formed over said actual and pseudo gates;

a conductive spacer formed around said actual and pseudo gates on said secondary oxide layer, said conductive spacer including an aperture over a portion of said actual gate;

a first contact to said actual gate through said portion of said actual gate corresponding to said aperture; and a second contact to said conductive spacer at said pseudo gate.

7. A method of making a transistor structure comprising the steps of:

forming a gate structure on a first oxide layer on a silicon structure;

forming a secondary oxide layer on said gate structure;

forming a conductive spacer around said gate structure on said secondary oxide layer;

removing said conductive spacer from a portion of said gate structure;

forming a first contact to said gate structure through said portion of said gate structure from which said conductive spacer has been removed; and forming a second contact to said conductive spacer.

8. A method of making a transistor structure comprising the steps of:

forming a gate on a first oxide layer on a silicon structure;

forming a conductive spacer connection support on said first oxide layer on said silicon structure but separated from said gate;

forming a secondary oxide layer on said gate and said conductive spacer connection support;

forming a conductive spacer around said gate and said conductive spacer connection support on said secondary oxide layer;

removing said conductive spacer from a portion of said gate;

forming a first contact to said gate through said portion of said gate structure from which said conductive spacer has been removed; and forming a second contact to said conductive spacer at said conductive spacer connection support.

9. A method of making a dual gate transistor structure comprising the steps of:

forming a gate structure on a first oxide layer on a silicon structure to define a first gate;

forming a secondary oxide layer over said gate structure;

forming a conductive spacer around said gate structure on said secondary oxide layer to define a second gate;

removing said conductive spacer from a portion of said gate structure;

forming a first contact to said first gate through said portion of said gate structure from which said conductive spacer has been removed; and forming a second contact to said conductive spacer.

10. A method of making a transistor structure comprising the steps of:

forming an actual gate on a first oxide layer on a silicon structure;

forming a pseudo gate on said first oxide layer on said silicon structure;

forming a secondary oxide layer over said actual gate and said pseudo gate;

forming a conductive spacer around said actual gate and said pseudo gate on said secondary oxide layer;

removing said conductive spacer from a portion of said actual gate;

forming a first contact to said actual gate through said portion of said actual gate from which said conductive spacer has been removed; and forming a second contact to said conductive spacer at said pseudo gate.

11. An integrated circuit structure comprising:

a first plurality of conventional LDD transistors; and a second plurality of transistors each comprising:

a gate structure formed on a first oxide layer on a silicon structure;

a secondary oxide layer formed on said gate structure;

a conductive spacer formed around said gate structure on said secondary oxide layer, said conductive spacer including an aperture over a portion of said gate structure;

a first contact to said gate structure through said portion of said gate structure corresponding to said aperture; and a second contact to said conductive spacer, said first plurality of conventional LDD transistors and said second plurality of transistors being interconnected to form said integrated circuit structure.

12. An integrated circuit structure as claimed in claim 11 wherein said integrated circuit structure is an array device.

13. An integrated circuit structure as claimed in claim 11 wherein said integrated circuit structure is a storage device.

14. A method of making an integrated circuit structure comprising the steps of:

forming gate structures on a first oxide layer on a silicon structure;

forming a secondary oxide layer on said gate structures;

forming conductive spacers around said gate structures;

utilizing said conductive spacers to form LDD transistor structures associated with a first number of said gate structures;

utilizing said conductive spacers to form transistor structures associated with a second number of said gate structures by performing the steps of:

removing said conductive spacer from portions of said second number of said gate structures;

forming first contacts to said second number of gate structures through said portions of said second number of gate structures from which said conductive spacer has been removed; and forming second contacts to said conductive spacers.

* * * * *